United States Patent
Xiao

(10) Patent No.: US 9,483,992 B2
(45) Date of Patent: Nov. 1, 2016

(54) GATE DRIVE CIRCUIT

(71) Applicant: Shenzhen China Star Optoelectronics Technology Co., Ltd., Shenzhen, Guangdong (CN)

(72) Inventor: Juncheng Xiao, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 14/418,166

(22) PCT Filed: Jan. 13, 2015

(86) PCT No.: PCT/CN2015/070566
§ 371 (c)(1),
(2) Date: May 9, 2016

(87) PCT Pub. No.: WO2016/095300
PCT Pub. Date: Jun. 23, 2016

(65) Prior Publication Data
US 2016/0248417 A1   Aug. 25, 2016

(30) Foreign Application Priority Data
Dec. 19, 2014   (CN) .......................... 2014 1 0804017

(51) Int. Cl.
*G09G 3/36* (2006.01)
*G11C 19/28* (2006.01)
(52) U.S. Cl.
CPC .............. *G09G 3/3677* (2013.01); *G11C 19/28* (2013.01); *G09G 2300/0408* (2013.01); *G09G 2310/0248* (2013.01)
(58) Field of Classification Search
CPC .............. G09G 3/3648; G09G 3/3677; G09G 2300/0408; G09G 2310/0248; G11C 19/28
See application file for complete search history.

(56) References Cited

U.S. PATENT DOCUMENTS

| 7,688,934 B2* | 3/2010 | Tsai ........................ G11C 19/28 377/64 |
| 8,351,563 B2* | 1/2013 | Yang .................... G09G 3/3677 377/64 |
| 8,537,094 B2* | 9/2013 | Yang .................... G09G 3/3677 345/100 |
| 9,240,156 B2* | 1/2016 | Dai ...................... G02F 1/13306 |

(Continued)

FOREIGN PATENT DOCUMENTS

| CN | 103745700 A | 4/2014 |
| CN | 104008739 A | 8/2014 |
| CN | 104008740 A | 8/2014 |

OTHER PUBLICATIONS

International Search Report and Written Opinion, Jan. 13, 2015, China.

*Primary Examiner* — Patrick O'Neil
(74) *Attorney, Agent, or Firm* — Kim Winston LLP

(57) ABSTRACT

A gate drive circuit comprising multistage gate drive on array (GOA) drive units is provided. Each stage of GOA drive unit comprises a pull-up control part, a pull-up part, a key pull-down part, and a pull-down holding part. The pull-down holding part comprises a bridging module, a first and a second pull-down holding modules. When the bridging module is in a shutoff state, the first and the second pull-down holding modules work alternately, whereby a potential at the gate signal output end and/or a potential at the control end of the pull-up part are/is kept at a potential of the direct current power source according to a pull-down holding control signal.

20 Claims, 4 Drawing Sheets

(56) References Cited

U.S. PATENT DOCUMENTS

Figure 1:
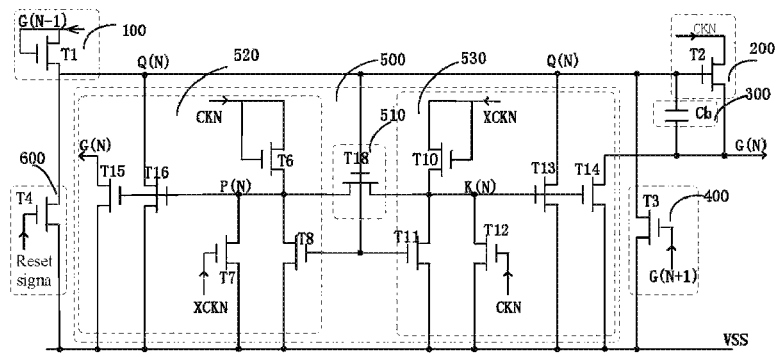

| | | | |
|---|---|---|---|
| 9,257,083 B2* | 2/2016 | Dai | G09G 3/006 |
| 2011/0150169 A1 | 6/2011 | Lin et al. | |
| 2016/0140922 A1* | 5/2016 | Dai | G09G 3/3648 |
| | | | 345/92 |
| 2016/0140926 A1* | 5/2016 | Xiao | G09G 3/3677 |
| | | | 345/215 |
| 2016/0140928 A1* | 5/2016 | Xiao | G09G 3/3648 |
| | | | 345/212 |
| 2016/0148589 A1* | 5/2016 | Cao | G09G 3/3677 |
| | | | 345/208 |

* cited by examiner

GATE DRIVE CIRCUIT

CROSS REFERENCE TO RELATED APPLICATION

The present application claims benefit of Chinese patent application CN 201410804017.2, entitled "Gate Drive Circuit" and filed on Dec. 19, 2014, which is incorporated herein by reference on its entirety.

TECHNICAL FIELD

The present disclosure relates to the technical field of display, and in particular, to a gate drive circuit of a liquid crystal display device.

TECHNICAL BACKGROUND

In the prior art, a gate drive circuit is usually formed on an array substrate through gate driver on array (GOA) technology during manufacturing of an array of a liquid crystal display panel, thereby realizing progressive scan driving of gate lines. Based on this technology, a bonding procedure of an external IC can be omitted, and the integration level of the liquid crystal display panel can be improved.

GOA circuit usually comprises multistage GOA units, each stage of GOA unit driving a corresponding horizontal scan line. Each stage of GOA unit mainly comprises a pull-up part, a pull-up control part, a transfer part, a key pull-down part, a pull-down holding part, a boost part for boosting an electrical potential, and a reset part for resetting the electrical potential.

The pull-up part is mainly used for outputting a clock signal as a gate signal. The pull-up control part controls a working time of the pull-up part, and is usually connected to a transfer signal outputted from a previous stage of GOA unit. The key pull-down part is used for pulling down the gate signal to a low potential, and the pull-down holding part is used for keeping the gate signal and a control signal of a pull-up circuit at low potential.

In addition, since low temperature poly-silicon (LTPS) arises, GOA circuits present evident differences in frameworks and types, and can be generally divided into circuit types including NMOS, PMOS, and CMOS. In the manufacturing process of CMOS, as many as 12 photomasks will be used, and for NMOS and PMOS, which are unipolar transistors, 9 photomasks or less will be used. Therefore, in order to save production cost, unipolar LTPS-based GOA circuit is widely used.

A conventional unipolar LTPS-based GOA circuit usually uses a single unit pull-down holding part. However, the long working time of the pull-down holding part would have adverse influence on the service life of the circuit. Furthermore, as for a large size LTPS display panel, due to large RC load of the GOA circuit, the service life thereof will also be shortened.

SUMMARY OF THE INVENTION

A technical problem to be solved by the present disclosure is to provide a unipolar low temperature poly-silicon (LTPS) based gate drive circuit, so that the service life of a GOA circuit can be improved.

A gate drive circuit is provided according to the present disclosure, comprising multistage gate driver on array (GOA) drive units, wherein each stage of GOA drive unit comprises a pull-up control part for outputting a pull-up control signal, a pull-up part, wherein a control end thereof is coupled to an output end of the pull-up control part, so that a potential at a gate signal output end is pulled up according to the pull-up control signal and a clock signal, whereby a gate signal is outputted from a current stage of GOA drive unit, a key pull-down part, which is coupled between a control end of the pull-up part and a direct current power source, so that a potential at the control end of the pull-up part is pulled down to a potential of the direct current power source according to a pull-down control signal, thereby disenabling the pull-up part, and a pull-down holding part coupled to the gate signal output end, the control end of the pull-up part and the direct current power source, comprising a bridging module, and a first and a second pull-down holding modules, wherein when the bridging module is in a shutoff state, pull-down holding control signals outputted respectively from the first and the second pull-down holding modules have complementary phases, so that the first and the second pull-down holding modules operate alternately, whereby a potential at the gate signal output end and/or a potential at the control end of the pull-up part are/is kept at a potential of the direct current power source according to the pull-down holding control signals.

In an embodiment according to the present disclosure, a control end of the bridging module is coupled to the output end of the pull-up control part, and a first end and a second end thereof are respectively coupled to output ends of pull-down holding control signal of the first and the second pull-down holding modules.

In an embodiment, the gate drive circuit further comprises:

a boost part, wherein a first end and a second end thereof are respectively coupled to the output end of the pull-up control part and the gate signal output end, so that the potential at the control end of the pull-up part is pulled up according to the pull-up control signal, and a circuit reset part, comprising a reset transistor, wherein a gate of the reset transistor receives a reset signal, and a first end and a second end thereof are respectively coupled to the output end of the pull-up control part and the direct current power source, so that electrostatic accumulation at the output end of the pull-up control part is eliminated according to the reset signal.

In an embodiment, the first and the second pull-down holding modules each comprise:

a first control submodule, a control end thereof receiving a first control signal, and an output end thereof being coupled to the output end of pull-down holding control signal, a second control submodule, a control end thereof receiving a second control signal, and an output end thereof being coupled to the output end of pull-down holding control signal, a first pull-down transistor, a gate thereof being coupled to the output end of pull-down holding control signal, a first end thereof being coupled to the gate signal output end, and a second end thereof being coupled to the direct current power source, and a second pull-down transistor, a gate thereof being coupled to the output end of pull-down holding control signal, a first end thereof being coupled to the output end of the pull-up control part, and a second end thereof being coupled to the direct current power source, wherein the first control signal and the second control signal have complementary phases.

In an embodiment, the first and the second pull-down holding modules each further comprise a third pull-down transistor, wherein a gate of the third pull-down transistor is coupled to the output end of the pull-up control part, a first end thereof is coupled to the output end of pull-down holding control signal, and a second end thereof is coupled to the direct current power source.

In an embodiment, the first control submodule of the first pull-down holding module comprises a first transistor, wherein a gate of the first transistor is short circuited with a first end thereof for receiving the first control signal, and a second end thereof is coupled to the output end of pull-down holding control signal of the first pull-down holding module, and the first control submodule of the second pull-down holding module comprises a second transistor, wherein a gate of the second transistor is short circuited with a first end thereof for receiving the second control signal, and a second end thereof is coupled to the output end of pull-down holding control signal of the second pull-down holding module.

In an embodiment, the first control submodule of the first pull-down holding module comprises a first Darlington transistor, wherein a base of the first Darlington transistor is short circuited with a first end thereof for receiving the first control signal, and a second end thereof is coupled to the output end of pull-down holding control signal of the first pull-down holding module, and the first control submodule of the second pull-down holding module comprises a second Darlington transistor, wherein a base of the second Darlington transistor is short circuited with a first end thereof for receiving the second control signal, and a second end thereof is coupled to the output end of pull-down holding control signal of the second pull-down holding module.

In an embodiment, the second control submodule of the first pull-down holding module comprises a third transistor, wherein a gate of the third transistor receives the second control signal, a first end thereof is coupled to the direct current power source, and a second end thereof is coupled to the output end of pull-down holding control signal of the first pull-down holding module, and the second control submodule of the second pull-down holding module comprises a fourth transistor, wherein a gate of the fourth transistor receives the first control signal, a first end thereof is coupled to the direct current power source, and a second end thereof is coupled to the output end of pull-down holding control signal of the second pull-down holding module.

In an embodiment, the second control submodule of the first pull-down holding module comprises a third transistor, wherein a gate of the third transistor receives the second control signal, a first end thereof receives the first control signal, and a second end thereof is coupled to the output end of pull-down holding control signal of the first pull-down holding module, and the second control submodule of the second pull-down holding module comprises a fourth transistor, wherein a gate of the fourth transistor receives the first control signal, a first end thereof receives the second control signal, and a second end thereof is coupled to the output end of pull-down holding control signal of the second pull-down holding module.

In an embodiment, the first control signal is a clock signal.

In an embodiment, the first control signal is a low frequency pulse signal, and when a next stage of GOA drive unit outputs a high potential gate signal, the first control signal experiences an inversion.

In an embodiment, the pull-up control part comprises a pull-up control transistor, wherein a gate of the pull-up control transistor is short circuited with a first end thereof for receiving a gate signal outputted through a previous stage of GOA drive unit, and a second end thereof outputs the pull-up control signal.

In an embodiment, the key pull-down part comprises a pull-down transistor, wherein a gate of the pull-down transistor receives the pull-down control signal, and a first end and a second end thereof are respectively coupled to the output end of the pull-up control part and the direct current power source, wherein the pull-down control signal is a gate signal outputted through a next stage of GOA drive unit.

As compared with an existing GOA drive unit, the present disclosure has the following advantages.

1. The pull-down holding part according to the present disclosure is configured as having a three phase voltage-dividing mode, so that suitable potentials of point P(N) and point K(N) during a working period and a non-working period of the circuit can be guaranteed. In this case, lower potential will be provided to P(N) and K(N) during a working period of a current stage of GOA unit, so that electric leakage from Q(N) and G(N) can be effectively prevented. In the meantime, a suitably high potential is provided to P(N) and K(N) during a non-working period, so that Q(N) and G(N) can be kept at a low potential during the non-working period.

2. According to the present disclosure, a gate line signal G(N) controls a transfer between a former stage and a latter stage, which does not require ST(N) cascade transmission signal of a conventional GOA drive circuit. As a result, the circuit configuration can be effectively simplified, the space for wiring can be saved, and the power consumption can be reduced.

3. According to the present disclosure, Darlington transistors are used in the control submodules of the pull-down holding part, so that electric leakage from P(N) and K(N) during the non-working period can be alleviated, and the pulling-down of the potentials of G(N) and Q(N) can be more smooth.

4. In the pull-down holding part according to the present disclosure, the control signal for controlling the two pull-down holding modules to work alternately is configured as low frequency pulse signal, so that the power consumption of the entire GOA drive circuit can be effectively reduced. Further, because the low frequency pulse signal, rather than a clock signal, is used to control the two pull-down holding modules to work alternately, a duty ratio of the clock signal can be flexibly configured according to different components and product models.

Other features and advantages of the present disclosure will be further explained in the following description and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE
ACCOMPANYING DRAWINGS

Figure 2:
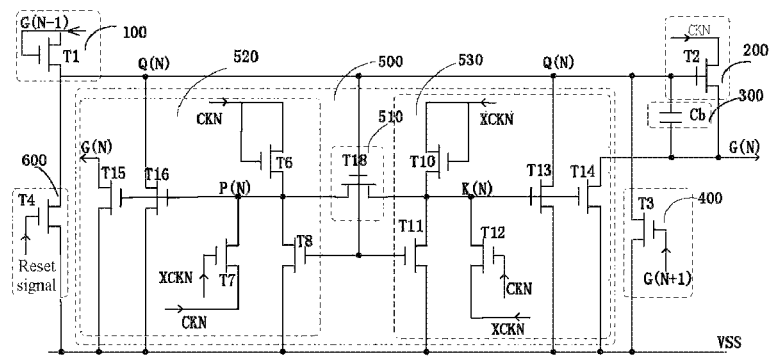
Figure 3:
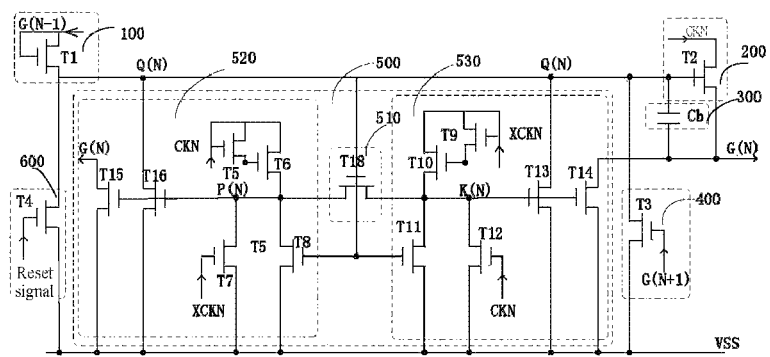
Figure 4:
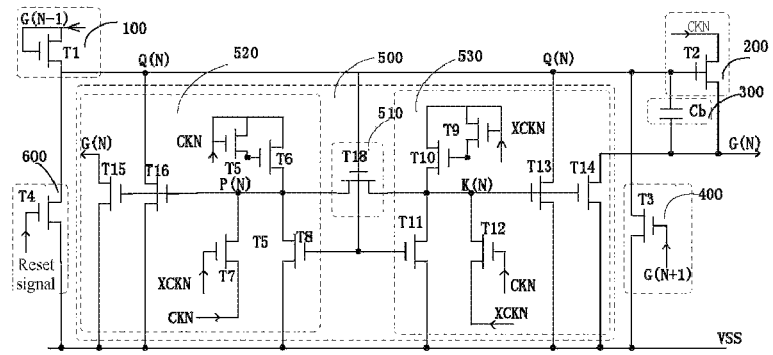
Figure 5:
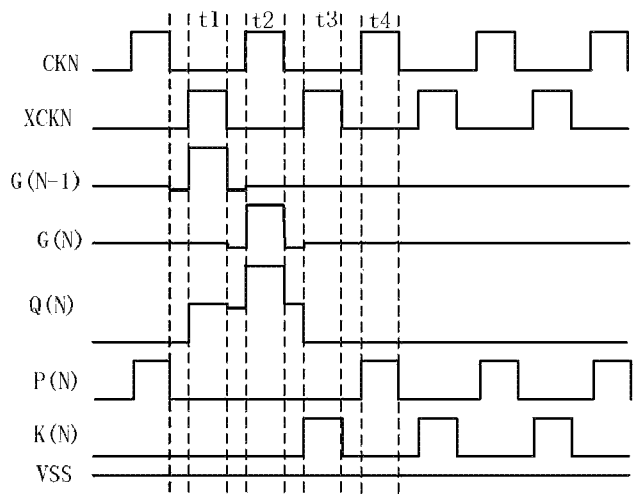
Figure 6:
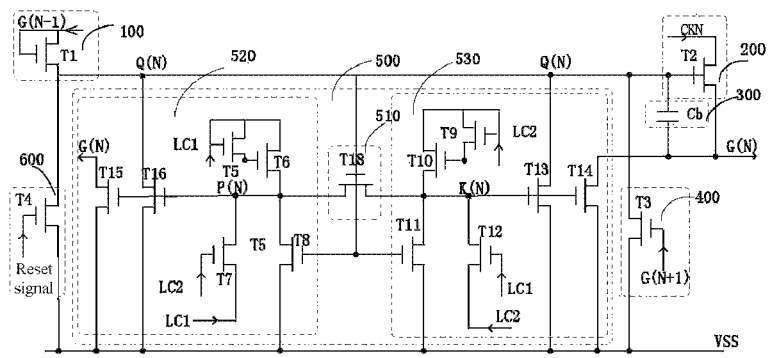
Figure 7:
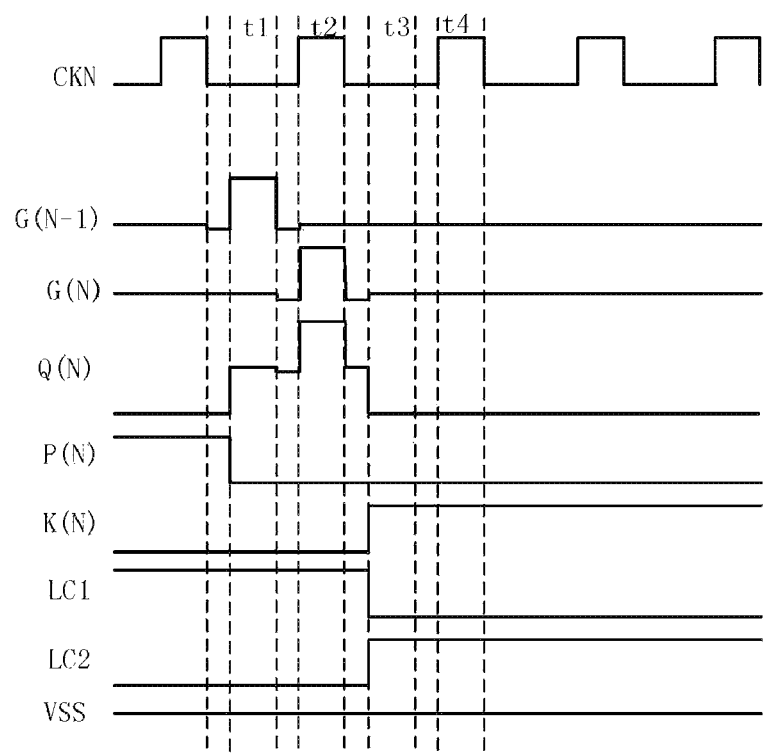

The accompanying drawings, which constitute a part of the description, are provided for further understanding the technical solution of the present disclosure together with the examples, they should not be construed as limitations thereto. In the drawings:

FIG. 1 schematically shows a circuit configuration of a gate driver on array drive unit according to example 1 of the present disclosure, FIG. 2 schematically shows a circuit configuration of a gate driver on array drive unit according to example 2 of the present disclosure, FIG. 3 schematically shows a circuit configuration of a gate driver on array drive unit according to example 3 of the present disclosure, FIG. 4 schematically shows a circuit configuration of a gate driver on array drive unit according to example 4 of the present disclosure, FIG. 5 shows a signal sequence diagram of the gate driver on array drive unit according to examples 1 to 4, FIG. 6 schematically shows a circuit configuration of a gate driver on array drive unit according to example 5 of the present disclosure, and FIG. 7 shows a signal sequence diagram of the gate driver on array drive unit according to example 5.

DETAILED DESCRIPTION OF THE EMBODIMENTS

In order to clarify the objective, technical solution, and advantages of the present disclosure, the present disclosure will be further described in detail in view of the accompanying drawings.

In an example according to the present disclosure, a unipolar low temperature poly-silicon (LTPS) based gate driver on array (GOA) circuit is provided. A ratio of a channel width W to a channel length L of the LTPS is relatively small. In this case, a parasitic resistance and a parasitic capacitance of a TFT element are relatively small, and thus will influence a stability of the circuit to a very slight extent. In addition, under the condition of alternating positive and negative voltages, an LTPS transistor experience very small drifting of a threshold value Vth thereof, so that no ripple elimination like an a-Si TFT element is necessary. As a result, it is unnecessary for an LTPS-based gate drive circuit to comprise multiple pull-down holding elements as a traditional a-Si GOA circuit does, whereby the gate drive circuit can be simplified, and favorable display effect can be realized simply through a basic GOA circuit.

The examples of the present disclosure are particularly suitable to be implemented on a flat panel display (FPD) product, so that a narrow-framed design or a frameless design can be realized. In addition, the LTPS elements in the GOA circuit according to the above example are all unipolar NMOS or PMOS elements, so that the number of photomasks needed in the manufacturing process can be reduced, whereby the production cost can be greatly reduced.

Example 1

FIG. 1 schematically shows of a circuit configuration of a gate driver on array (GOA) drive unit according to example 1 of the present disclosure. FIG. 1 shows one of the multiple stages of GOA drive units indicated as N. For easy illustration, a stage before said GOA drive unit N is indicated as N−1, and a stage thereafter is indicated as N+1.

The GOA drive unit as shown in FIG. 1 comprises a pull-up control part 100, a pull-up part 200, a boost part 300, a key pull-down part 400, a pull-down holding part 500, and a circuit reset part 600.

The pull-up control part 100 comprises a pull-up control transistor T1. A gate of the pull-up control transistor T1 is short circuited with a first end thereof, and receives a gate signal G(N−1) outputted from a (N−1)$^{th}$ stage of GOA unit, and outputs a pull-up control signal G(N−1).

The pull-up part 200 comprises a pull-up transistor T2. A gate of the pull-up transistor T2 is coupled to an output end (point Q(N) in the drawings) of the pull-up control part 100, and receives the pull-up control signal G(N−1) outputted from the pull-up control part 100. Under the action of the pull-up control signal G(N−1), the transistor T2 pulls up a potential at a gate signal output end (point G(N) in the drawings) based on a clock signal CKN, so that the current stage of GOA drive unit can output a gate signal.

The boost part 300 comprises a storage capacitor Cb. An upper electrode and a lower electrode of the storage capacitor Cb are respectively coupled to the output end (point Q(N) in the drawings) of the pull-up control part 100 and the gate signal output end (point G(N) in the drawings). The storage capacitor Cb boosts a potential of point Q(N) twice, so that the current GOA drive unit can output the gate signal G(N) normally.

The key pull-down part 400 comprises a transistor T3. A gate of transistor T3 receives a pull-down control signal, i.e., a gate signal G(N+1) outputted from a (N+1)$^{th}$ stage of GOA drive unit. A source and a drain of transistor T3 are respectively coupled to the output end (point Q(N) in the drawings) of the pull-up control part 100 and a direct current power source VSS.

The pull-down holding part 500 is coupled to the gate signal output end (point G(N) in the drawings), and between a control end (point Q(N) in the drawings) of the pull-up part and the direct current power source VSS. The pull-down holding part 500 comprises a bridging module 510, a first pull-down holding module 520, and a second pull-down holding module 530.

The first pull-down holding module 520 comprising transistors T6, T7, T8, T15, and T16 is taken as an example. A first transistor T6 constitutes a first control submodule, and a third transistor T7 constitutes a second control submodule. A gate of the first transistor T6 is short circuited with a first end thereof, and receives a first control signal CKN, and a second end thereof is coupled to an output end of pull-down holding control signal (point P(N) in the drawings) of the pull-down holding module 520. A gate of the third transistor T7 receives a second control signal XCKN, and a source and a drain thereof are respectively coupled to the direct current power source VSS and point P(N). A gate of a first pull-down transistor T15 and that of a second pull-down transistor T16 are coupled to point P(N) for receiving pull-down holding control signals outputted from transistors T6 and T7. A source and a drain of transistor T15 are respectively coupled to the gate signal output end (point G(N) in the drawings) and the direct current power source VSS. A source and a drain of transistor T16 are respectively coupled to the output end (point Q(N) in the drawings) of the pull-up control part 100 and the direct current power source VSS. A gate of a third pull-down transistor T8 is coupled to the output end (point Q(N) in the drawings) of the pull-up control part 100, and a source and a drain thereof are respectively coupled to point P(N) and the direct current power source VSS.

Similar to the first pull-down holding module 520, the second pull-down holding module 530 comprises transistors T10, T11, T12, T13, and T14. An output end of pull-down holding control signal is indicated as a point K(N) in the accompanying drawings. A second transistor T10 receives the second control signal XCKN, and a gate of a fourth transistor T12 receives the first control signal CKN.

The bridging module 510 comprises a transistor T18. A gate of transistor T18 is coupled to the output end (point Q(N) in the drawings) of the pull-up control part 100, and a source and a drain thereof are respectively coupled to point P(N) of the first pull-down holding module 520 and point K(N) of the second pull-down holding module 530.

The circuit reset part 600 comprises a reset transistor T4. A gate of the reset transistor T4 receives a reset signal, and a source and a drain thereof are respectively coupled to the output end (point Q(N) in the drawings) of the pull-up control part 100 and the direct current power source VSS. Preferably, the reset signal is provided within a blanking time of one or more frames. The direct current power source VSS can be configured as a negative voltage source, so that an electrostatic accumulation at point Q(N) can be eliminated based on the reset signal.

Hereinafter, the working principle of a $N^{th}$ stage of GOA drive unit will be explained in detail in view of a signal sequence diagram as shown in FIG. 5. In an example as shown in FIG. 5, a first clock signal CKN and a second clock signal XCKN are two sets of pulse signal with complementary phases, and a duty ratio of CKN and that of XCKN each are slightly smaller than 50%. It should be noted that the duty ratio of clock signal of a transistor with good electrical characteristics, such as IGZO (indium gallium zinc oxide) and LTPS, can be designed below 50%.

In a time period t1, G(N−1) is of high potential, T1 is turned on, and an output end of T1 is of high potential. In this case, the storage capacitor Cb is charged to a first potential under the action of G(N−1), i.e., a potential of Q(N) is boosted to the first potential, and at the same time T2, T8, T11, and T18 are turned on. T8 is turned on, so that point P(N) is connected to the direct current power source VSS. T11 is turned on, so that point K(N) is connected to the direct current power source VSS. In addition, because CKN is of low potential and XCKN is of high potential, T6 and T12 are cut off, and T7 and T10 are turned on. T7 is on, so that point P(N) is connected to the direct current power source VSS. T10 is on, so that point K(N) is connected to the high potential of XCKN. Because T18 is turned on, one of points P(N) and K(N), which is of low potential, will pull down the other end, which is of high potential, so that T13, T14, T15, and T16 are cut off, thereby preventing electric leakage form Q(N) and G(N). Because T2 is on and CKN is of low potential, G(N) is kept at the low potential of CKN.

In a time period t2, G(N−1) is of low potential and T1 is cut off. Due to an energy storage function of Cb, the gate of T2 is kept at high potential and T2 is kept on. Because Q(N) is kept at high potential, T8, T11, and T18 are all kept on. T8 is turned on, so that point P(N) is connected to the direct current power source VSS. T11 is turned on, so that point K(N) is connected to the direct current power source VSS. Furthermore, because CKN is of high potential and XCKN is of low potential, T6 and T12 are turned on, and T7 and T10 are cut off.

T6 is turned on, so that point P(N) is connected to the high potential of CKN. T12 is turned on, so that point K(N) is connected to the direct current power source VSS. Because T18 is on, one of point P(N) and point K(N), which is of low potential, will pull down the other end, which is of high potential, so that T13, T14, T15, and T16 are cut off, thereby preventing electric leakage form Q(N) and G(N).

Because T2 is turned on and CKN is of high potential, Cb is charged again under the action of CKN and reaches a second potential higher than a first potential, i.e., the potential of Q(N) is boosted to the second potential higher than the first potential. Because T2 is turned on and CKN is of high potential, G(N) is pulled up to the high potential of CKN.

In a time period t3, because a gate signal G(N+1) outputted through a $(N+1)^{th}$ stage of GOA drive unit is of high potential, T3 is turned on, whereby a potential of point Q(N) declines to a potential of the direct current power source VSS. Because point Q(N) is of low potential, T2, T8, T11, and T18 are kept off. In addition, because CKN is of low potential and XCKN is of high potential, T6 and T12 are cut off, and T7 and T10 are turned on.

T7 is turned on, so that point P(N) is connected to the direct current power source VSS. T10 is turned on, so that point K(N) is connected to the high potential of XCKN. In this case, because T18 is in an off state, it is equivalent to large resistance; and because T7 and T10 are on, they are equivalent to small resistance. T7, T18, and T10 are in series connection and form a three-phase resistive voltage dividing circuit. A potential of point P(N) is a low potential of the direct current power source VSS, and that of point K(N) is the high potential of XCKN. In other words, the phase of point P(N) and that of point K(N) are complementary to each other.

Because point P(N) is of low potential, T15 and T16 are cut off. Point K(N) is of high potential, thus T13 and T14 are turned on, whereby a potential of point G(N) and that of point Q(N) are kept at the low potential of the direct current power source VSS.

In a time period t4, since the potential of point Q(N) has been pulled down to the low potential of the direct current power source VSS in the previous time period, T8, T11, and T18 are kept off. In addition, CKN is of high potential and XCKN is of low potential, thus T6 and T12 are turned on, and T7 and T10 are cut off.

T6 is turned on, so that point P(N) is connected to the high potential of CKN. T12 is turned on, so that point K(N) is connected to the direct current power source VSS. In this case, because T18 is in an off state, it is equivalent to large resistance; and because T6 and T12 are on, they are equivalent to small resistance. T6, T18, and T12 are in series connection and form a three-phase resistive voltage dividing circuit. A potential of point K(N) is a low potential of the direct current power source VSS, and that of point P(N) is the high potential of XCKN. In other words, the phase of point P(N) and that of point K(N) are complementary to each other.

Because point K(N) is of low potential, T13 and T14 are cut off. Point P(N) is of high potential, thus T15 and T16 are turned on, whereby a potential of point G(N) and that of point Q(N) are kept at the low potential of the direct current power source VSS.

Hereafter, as long as a new high potential gate output signal G(N−1) from the $(N-1)^{th}$ stage of GOA drive unit does not arrive, the $N^{th}$ stage of GOA drive unit will work alternately between the state of the time period t3 and that of the time period t4.

Based on the above analysis on the signal sequence, in a working period of the gate signal G(N), T8 and T11 exert strong pulling-down force on point P(N) and point K(N). In a non-working period of the gate signal G(N), the first pull-down holding module 520 and the second pull-down holding module 530 work alternately. In this period, T6, T18, and T12 form a group, and T10, T18, and T7 form a group. The above two groups of circuits function alternately and respectively control the action time of T15 and T16, and that of T13 and T14. In this case, point P(N) and point K(N) can have high potential in an alternate manner, so that the potential at the gate signal output end G(N) and that at the control end of the pull-up part 200 can be kept low, whereby the stability thereof can be improved.

As a result of the GOA unit using the three-phase voltage dividing mode comprising the bridging module 510, the first pull-down holding module 520, and the second pull-down holding module 530, the service life of the pull-down holding part 500 can be increased.

Example 2

FIG. 2 schematically shows a circuit configuration of a gate driver on array drive unit according to example 2 of the present disclosure. The circuit is based on the circuit as shown in FIG. 1, with improvements on the pull-down holding part 500 thereof. Specifically, a source of a third transistor T7 receives a first control signal CKN, and a source of a fourth transistor T12 receives a second control signal XCKN. An absolute value of a low potential of CKN and that of XCKN are configured larger than an absolute value of a potential of a direct current power source VSS, thereby a force for pulling down the potential within a non-working period can be made stronger through the low potentials of CKN and XCKN.

Example 3

FIG. 3 schematically shows a circuit configuration of a gate driver on array drive unit according to example 3 of the present disclosure. The circuit is based on the circuit as shown in FIG. 1, with improvements on the pull-down holding part 500 thereof. Specifically, the circuit according to the present example further comprises transistors T5 and T9, so that T5 and T6 constitute a first Darlington transistor, and T9 and T10 constitute a second Darlington transistor.

A base of the first Darlington transistor is short circuited with a first end thereof for receiving a first control signal CKN, and a second end thereof is coupled to an output end P(N) of pull-down holding control signal of a first pull-down holding module. Specifically, a gate of transistor T5 is short circuited with a first end thereof for receiving the first control signal CKN. A gate of transistor T6 is coupled to a second end of transistor T5, a first end thereof is coupled to the gate of T5, and a second end thereof is coupled to point P(N).

A base of the second Darlington transistor is short circuited with a first end thereof for receiving a second control signal XCKN, and a second end thereof is coupled to an output end K(N) of pull-down holding control signal of a second pull-down holding module. Specifically, a gate of transistor T9 is short circuited with a first end thereof for receiving the second control signal XCKN. A gate of transistor T10 is coupled to a second end of transistor T9, a first end thereof is coupled to the gate of T9, and a second end thereof is coupled to point K(N).

Because the Darlington transistor has the advantages of high gain, fast switching speed, good stability, and the like, by introducing T5 and T9, electric leakage from P(N) and K(N) within a non-working period can be reduced, thereby the pulling-down of the potentials of G(N) and Q(N) can be more smooth.

Example 4

FIG. 4 schematically shows a circuit configuration of a gate driver on array drive unit according to example 4 of the present disclosure. The circuit is an integration of the three GOA drive unit types as shown in FIG. 1, FIG. 2, and FIG. 3, and has all the functions and advantages of the above three circuits. The functions and advantages of the three drive units has been described in detail hereinabove, thus will not be further described.

Example 5

FIG. 6 schematically shows a circuit configuration of the gate driver on array drive unit according to example 5 of the present disclosure. On the basis of the GOA drive unit as shown in FIG. 4, in FIG. 6, the control signals inputted to the pull-down holding modules 520 and 530 are respectively altered to low frequency clock signals LC1 and LC2, whereby the power consumption of the entire pull-down holding part 500 can be reduced.

FIG. 7 shows a signal sequence diagram of a gate driver on array drive unit according to example 5. Working principles of the circuit will be described in detail, taking time periods t3 and t4 as examples.

In time period t3, because a gate signal G(N+1) outputted from a (N+1)$^{th}$ stage of GOA drive unit is of high potential, T3 is turned on, whereby a potential of point Q(N) decreases to a potential of the direct current power source VSS. Because point Q(N) is of low potential, T2, T8, T11, and T18 are kept off. In addition, since LC1 is of low potential and LC2 is of high potential, T5, T6, and T12 are cut off, and T7, T9, and T10 are turned on.

T7 is turned on, so that point P(N) is connected to the direct current power source VSS. T9 and T10 are turned on, so that point K(N) is connected to the high potential of LC2. At this time, since T18 is cut off, it is equivalent to large resistance, thus can be deemed as in an off state. And because T7, T9, and T10 are on, they can be deemed as small resistance. T7, T18, and T9 and T10 are in series connection and form a three-phase resistive voltage dividing circuit.

A potential of point P(N) is the low potential of the clock signal LC1, and that of point K(N) is the high potential of LC2. In other words, point P(N) and point K(N) have complementary phases. Because point P(N) is of low potential, T15 and T16 are cut off. And because point K(N) is of high potential, T13 and T14 are turned on, thereby a potential of G(N) and that of Q(N) can be kept at the low potential of the direct current power source VSS.

In time period t4, since LC1 is of low potential and LC2 is of high potential, T5, T6, and T12 are cut off, and T7, T9, and T10 are turned on. Because point Q(N) is of low potential, T2, T8, T11, and T18 are kept off. The potential of point P(N) is kept at the low potential of the clock signal LC1, and that of point K(N) is kept at the high potential of LC2.

Based on the above analysis on the signal sequence, since time period t3, only the pull-down holding module 530 continues working, keeping the potentials of G(N) and Q(N) at the low potential of the direct current power source VSS. Upon the arrival of a new high potential gate output signal G(N+1) outputted from (N+1)$^{th}$ stage of GOA drive unit, the clock signals LC1 and LC2 experience inversions, so that the pull-down holding module 520 starts working, and the pull-down holding module 530 stops working. As a result, the potentials of P(N) and K(N) are being continuously pulled down under the control of LC1 and LC2, thereby preventing abnormal output from G(N) and Q(N).

Similar to example 2, the absolute values of the low potentials of LC1 and LC2 can be set larger than that of the potential of the direct current power source VSS, so that during a non-working period, a potential pulling-down force can be made stronger to keep the potential at low level through the low potentials of LC1 and LC2. Since it is unnecessary to control the two pull-down holding modules to work alternately through a clock signal, a duty ratio of the clock signal can be flexibly configured according to different components and product models.

It should be noted that in the above examples, a configuration of the sequence signal is directed to an N type switching element. It should be easy for one skilled in the art to understand that as for a P type switching element, under the circumstance that the high potential and the low potential of a circuit node can be interchanged correspondingly, while the sequence remaining the same, the technical solutions of the above examples can still be implemented.

The above embodiments are described only for better understanding, rather than restricting, the present disclosure. Any person skilled in the art can make amendments to the implementing forms or details without departing from the spirit and scope of the present disclosure. The scope of the present disclosure should still be subjected to the scope defined in the claims.

The invention claimed is:

1. A gate drive circuit, comprising multistage gate driver on array (GOA) drive units, wherein each stage of GOA drive unit comprises:
    a pull-up control part for outputting a pull-up control signal;
    a pull-up part, wherein a control end thereof is coupled to an output end of the pull-up control part, so that a potential at a gate signal output end is pulled up according to the pull-up control signal and a clock signal, whereby a gate signal is outputted from a current stage of GOA drive unit;
    a key pull-down part, which is coupled between a control end of the pull-up part and a direct current power source, so that a potential at the control end of the pull-up part is pulled down to a potential of the direct current power source according to a pull-down control signal, thereby disenabling the pull-up part;
    and a pull-down holding part coupled to the gate signal output end, the control end of the pull-up part and the direct current power source, comprising a bridging module, and a first and a second pull-down holding modules,
    wherein
    when the bridging module is in a shutoff state, pull-down holding control signals outputted respectively from the first and the second pull-down holding modules have complementary phases, so that the first and the second pull-down holding modules operate alternately, thereby a potential at the gate signal output end and/or a potential at the control end of the pull-up part are/is kept at a potential of the direct current power source according to the pull-down holding control signals.

2. The gate drive circuit according to claim 1, wherein a control end of the bridging module is coupled to the output end of the pull-up control part, and a first end and a second end thereof are respectively coupled to output ends of pull-down holding control signal of the first and the second pull-down holding modules.

3. The gate drive circuit according to claim 2, wherein the key pull-down part comprises a pull-down transistor, wherein a gate of the pull-down transistor receives the pull-down control signal, and a first end and a second end thereof are respectively coupled to the output end of the pull-up control part and the direct current power source, and
    the pull-down control signal is gate signal from a next stage of GOA drive unit.

4. The gate drive circuit according to claim 1, further comprising:
    a boost part, wherein a first end and a second end thereof are respectively coupled to the output end of the pull-up control part and the gate signal output end, so that the potential at the control end of the pull-up part is pulled up according to the pull-up control signal, and
    a circuit reset part, comprising a reset transistor, wherein a gate of the reset transistor receives a reset signal, and a first end and a second end thereof are respectively coupled to the output end of the pull-up control part and the direct current power source, so that electrostatic accumulation at the output end of the pull-up control part is eliminated according to the reset signal.

5. The gate drive circuit according to claim 4, wherein the key pull-down part comprises a pull-down transistor, wherein a gate of the pull-down transistor receives the pull-down control signal, and a first end and a second end thereof are respectively coupled to the output end of the pull-up control part and the direct current power source, and
    the pull-down control signal is gate signal from a next stage of GOA drive unit.

6. The gate drive circuit according to claim 1, wherein the first and the second pull-down holding modules each comprise:
    a first control submodule, a control end thereof receiving a first control signal, and an output end thereof being coupled to the output end of pull-down holding control signal,
    a second control submodule, a control end thereof receiving a second control signal, and an output end thereof being coupled to the output end of pull-down holding control signal,
    a first pull-down transistor, a gate thereof being coupled to the output end of pull-down holding control signal, a first end thereof being coupled to the gate signal output end, and a second end thereof being coupled to the direct current power source, and
    a second pull-down transistor, a gate thereof being coupled to the output end of pull-down holding control signal, a first end thereof being coupled to the output end of the pull-up control part, and a second end thereof being coupled to the direct current power source,
    wherein the first control signal and the second control signal have complementary phases.

7. The gate drive circuit according to claim 6, wherein the first and the second pull-down modules each further comprise a third pull-down transistor, wherein a gate of the third pull-down transistor is coupled to the output end of the pull-up control part, a first end thereof is coupled to the output end of pull-down holding control signal, and a second end thereof is coupled to the direct current power source.

8. The gate drive circuit according to claim 7, wherein the key pull-down part comprises a pull-down transistor, wherein a gate of the pull-down transistor receives the pull-down control signal, and a first end and a second end thereof are respectively coupled to the output end of the pull-up control part and the direct current power source, and
    the pull-down control signal is gate signal from a next stage of GOA drive unit.

9. The gate drive circuit according to claim 6, wherein the first control submodule of the first pull-down holding module comprises a first transistor, wherein a gate of the first transistor is short circuited with a first end thereof for receiving the first control signal, and a second end thereof is coupled to the output end of pull-down holding control signal of the first pull-down holding module, and the first control submodule of the second pull-down holding module comprises a second transistor, wherein a gate of the second transistor is short circuited with a first end thereof for receiving the second control signal, and a second end thereof is coupled to the output end of pull-down holding control signal of the second pull-down holding module.

10. The gate drive circuit according to claim 9, wherein the second control submodule of the first pull-down holding module comprises a third transistor, wherein a gate of the third transistor receives the second control signal, a first end thereof is coupled to the direct current power source, and a second end thereof is coupled to the output end of pull-down holding control signal of the first pull-down holding module, and the second control submodule of the second pull-down holding module comprises a fourth transistor, wherein a gate of the fourth transistor receives the first control signal, a first end thereof is coupled to the direct current power source, and a second end thereof is coupled to the output end of pull-down holding control signal of the second pull-down holding module.

11. The gate drive circuit according to claim 9, wherein the second control submodule of the first pull-down holding module comprises a third transistor, wherein a gate of the third transistor receives the second control signal, a first end thereof receives the first control signal, and a second end thereof is coupled to the output end of pull-down holding control signal of the first pull-down holding module, and the second control submodule of the second pull-down holding module comprises a fourth transistor, wherein a gate of the fourth transistor receives the first control signal, a first end thereof receives the second control signal, and a second end thereof is coupled to the output end of pull-down holding control signal of the second pull-down holding module.

12. The gate drive circuit according to claim 6, wherein the first control submodule of the first pull-down holding module comprises a first Darlington transistor, wherein a base of the first Darlington transistor is short circuited with a first end thereof for receiving the first control signal, and a second end thereof is coupled to the output end of pull-down holding control signal of the first pull-down holding module, and the first control submodule of the second pull-down holding module comprises a second Darlington transistor, wherein a base of the second Darlington transistor is short circuited with a first end thereof for receiving the second control signal, and a second end thereof is coupled to the output end of pull-down holding control signal of the second pull-down holding module.

13. The gate drive circuit according to claim 12, wherein the second control submodule of the first pull-down holding module comprises a third transistor, wherein a gate of the third transistor receives the second control signal, a first end thereof is coupled to the direct current power source, and a second end thereof is coupled to the output end of pull-down holding control signal of the first pull-down holding module, and the second control submodule of the second pull-down holding module comprises a fourth transistor, wherein a gate of the fourth transistor receives the first control signal, a first end thereof is coupled to the direct current power source, and a second end thereof is coupled to the output end of pull-down holding control signal of the second pull-down holding module.

14. The gate drive circuit according to claim 12, wherein the second control submodule of the first pull-down holding module comprises a third transistor, wherein a gate of the third transistor receives the second control signal, a first end thereof receives the first control signal, and a second end thereof is coupled to the output end of pull-down holding control signal of the first pull-down holding module, and the second control submodule of the second pull-down holding module comprises a fourth transistor, wherein a gate of the fourth transistor receives the first control signal, a first end thereof receives the second control signal, and a second end thereof is coupled to the output end of pull-down holding control signal of the second pull-down holding module.

15. The gate drive circuit according to claim 6, wherein the first control signal is clock signal.

16. The gate drive circuit according to claim 15, wherein the key pull-down part comprises a pull-down transistor, wherein a gate of the pull-down transistor receives the pull-down control signal, and a first end and a second end thereof are respectively coupled to the output end of the pull-up control part and the direct current power source, and the pull-down control signal is gate signal from a next stage of GOA drive unit.

17. The gate drive circuit according to claim 6, wherein the first control signal is low frequency pulse signal, and when a next stage of GOA drive unit outputs a high potential gate signal, the first control signal experiences an inversion.

18. The gate drive circuit according to claim 17, wherein the key pull-down part comprises a pull-down transistor, wherein a gate of the pull-down transistor receives the pull-down control signal, and a first end and a second end thereof are respectively coupled to the output end of the pull-up control part and the direct current power source, and the pull-down control signal is gate signal from a next stage of GOA drive unit.

19. The gate drive circuit according to claim 6, wherein the key pull-down part comprises a pull-down transistor, wherein a gate of the pull-down transistor receives the pull-down control signal, and a first end and a second end thereof are respectively coupled to the output end of the pull-up control part and the direct current power source, and the pull-down control signal is gate signal from a next stage of GOA drive unit.

20. The gate drive circuit according to claim 1, wherein the pull-up control part comprises a pull-up control transistor, wherein a gate of the pull-up control transistor is short circuited with a first end thereof for receiving a gate signal from a previous stage of GOA drive unit, and a second end thereof outputs the pull-up control signal.

* * * * *